(12) United States Patent
Tatsumi

(10) Patent No.: US 6,385,746 B1
(45) Date of Patent: May 7, 2002

(54) MEMORY TEST CIRCUIT

(75) Inventor: Takashi Tatsumi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/413,196

(22) Filed: Oct. 5, 1999

(30) Foreign Application Priority Data

May 31, 1999 (JP) .......................................... 11-152560

(51) Int. Cl.[7] .............................................. G11C 29/00
(52) U.S. Cl. ..................... 714/718; 714/720; 365/201; 365/230.03; 365/230.06; 711/5; 711/154
(58) Field of Search ...................... 714/718, 42, 743, 714/820, 719, 720; 365/201, 230.03, 230.06; 711/5, 154; 716/4

(56) References Cited

U.S. PATENT DOCUMENTS 4,759,021 A * 7/1988 Kawaguchi et al. ........ 714/743
4,833,677 A * 5/1989 Jarwala et al. ................. 714/42
5,995,731 A * 11/1999 Crouch et al. .................. 716/4
6,021,459 A * 2/2000 Norman et al. ................. 711/5

FOREIGN PATENT DOCUMENTS

JP          A-5/108469       4/1993
JP          A-5/189304       7/1993

* cited by examiner

Primary Examiner—Emmanuel L. Moise
(74) Attorney, Agent, or Firm—Burns, Doane, Swecker & Mathis, LLP

(57) ABSTRACT

A memory test circuit having access control circuits (11 and 12, or 21 and 22, or 31 and 32) recognizes a first memory circuit (101) and a second memory circuit (102), as one continuous memory, incorporated in a semiconductor processing device based on addresses and control commands provided from an external device. The memory test circuit then executes a memory test operation for the first and second memory circuits (101 and 102) continuously.

4 Claims, 8 Drawing Sheets

| TEST COMMAND <0:3> | MNEMONIC |
|---|---|
| 0 | NOP |
| 1 | KEEP |
| 2 | SET |
| 3 | RAS |
| 4 | CAS1 |
| 5 | CAS2 |
| 6 | CAS3 |
| 7 | CBRIN |
| 8 | CBROUT |
| 9 | SELFOUT |
| a | RAS1 |
| b | KEEP2 |
| c | reserved |
| d | reserved |
| e | reserved |
| f | reserved |

MEMORY TEST CIRCUIT

BACKGROUND OF THE INVENTION

1. Field of the Invention

The present invention relates to a memory test circuit capable of efficiently and easily executing a memory test operation for a plurality of memory circuits having different operation timings and accessing methods incorporated in a system such as a semiconductor processing device, and, more particularly, to a memory test circuit mounted on a no semiconductor processing device realizing easy memory test operation for a plurality of memory circuits having different operation timings that are executed by using different access commands.

2. Description of the Related Art

Figure 1:
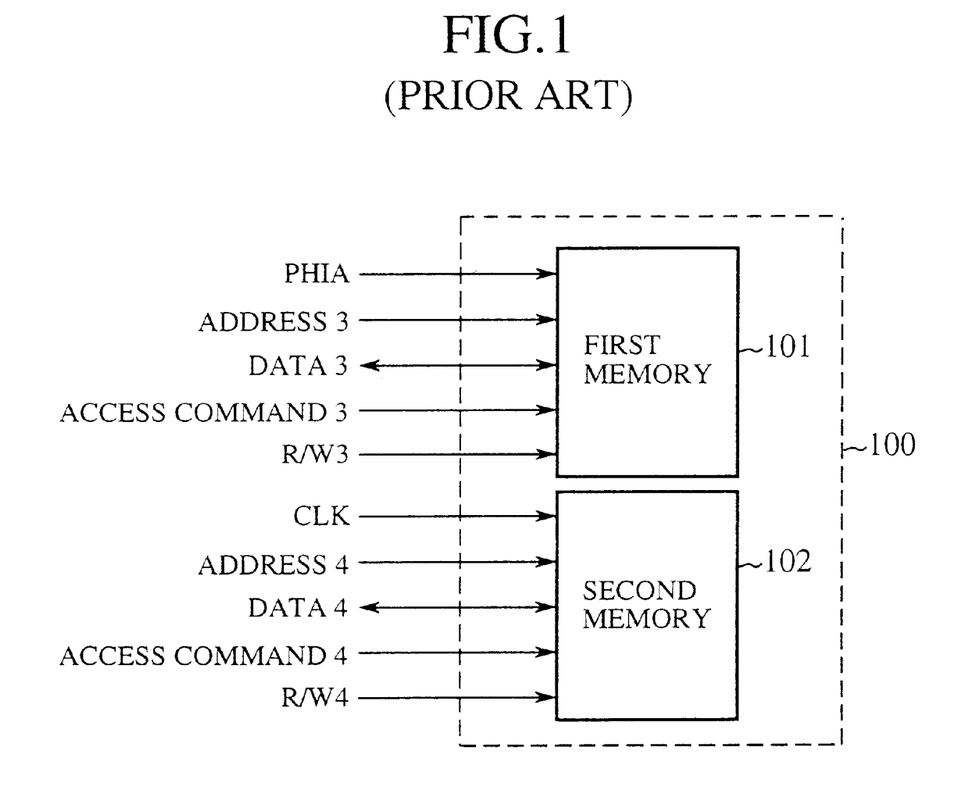
FIG. 1 is a block diagram showing a system configuration of a conventional semiconductor processing device on which two kinds of memory circuits are mounted.

FIG. 1 is a block diagram showing a system configuration of a conventional semiconductor processing device on which two kinds of memory circuits are mounted. The memory circuits have different operation timings and operate based on different access commands.

In FIG. 1, the reference number 101 designates a first memory circuit whose memory size is 1 MB, and 102 denotes a second memory circuit whose memory size is 1 MB. Those memory circuits 101 and 102 are different in type. For example, the memory circuits 101 and 102 use different access commands and have different operation timings. The reference number 100 indicates a system as a conventional semiconductor processing device on which the first memory circuit 101 and the second memory circuit 102 are mounted. Each of the first memory circuit 101 and the second memory circuit 102 is a Dynamic Random Access Memory (DRAM).

The first memory circuit 101 and the second memory circuit 102 input address signals indicating addresses ADDRESS 3 and 4, access commands 3 and 4 as control signals, and other control signals R/W 3 and 4 to be used for controlling data read/write access operation, and then outputs data items DATA 3 and DATA 4 according to the above addresses and the control signals, respectively.

Figure 2:
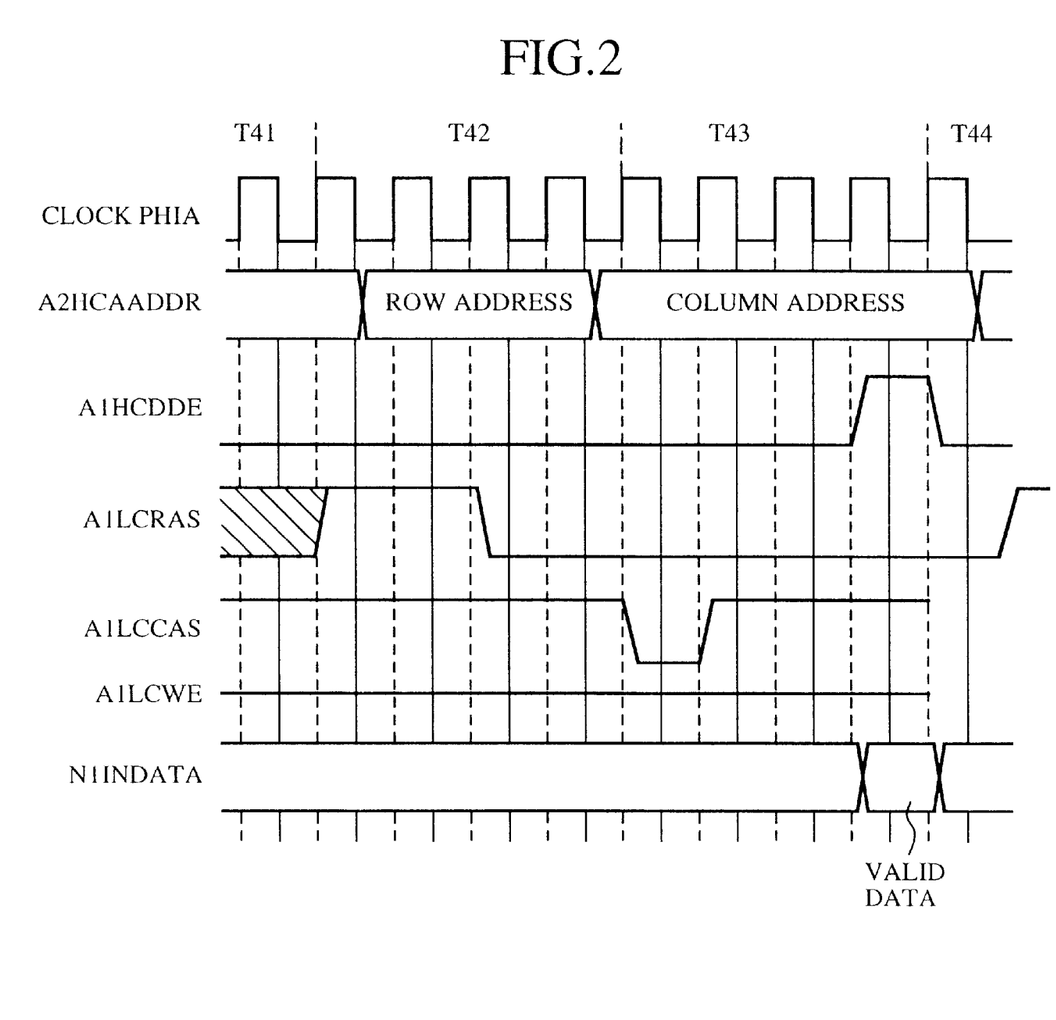
FIG. 2 is a timing chart showing the timing of a data read operation in the first memory circuit.

FIG. 2 is a timing chart showing the timing of a data read operation in the first memory 101. In FIG. 2, the reference character PHIA designates a clock signal to be used for the operation of the first memory 101, and A2HCAADDR denotes an address signal such as a row address and a column address. The reference character A1HCDDE indicates a control signal that indicates a timing to output data read from the first memory circuit 101 to data bus (not shown). The reference characters A1LCRAS and A1LCCAS designate a RAS signal and a CAS signal for the first memory 101, respectively.

The reference character A1LCWE designates a control signal indicating a data write to the memory when its level is a Low level (L level), and a data read from the memory when its level is a High level (H level).

FIG. 2 shows a case of the data read because the control signal A1LCWE is the H level. The reference character N1INDATA designates data on the data bus that is read out from the first memory circuit 101 as a DRAM.

The second memory circuit 102 operates based on a clock signal CLK of 25 MHz and it is different in operation timing from the first memory circuit 101 that operates based on a clock signal of 100 MHz.

Figure 3:
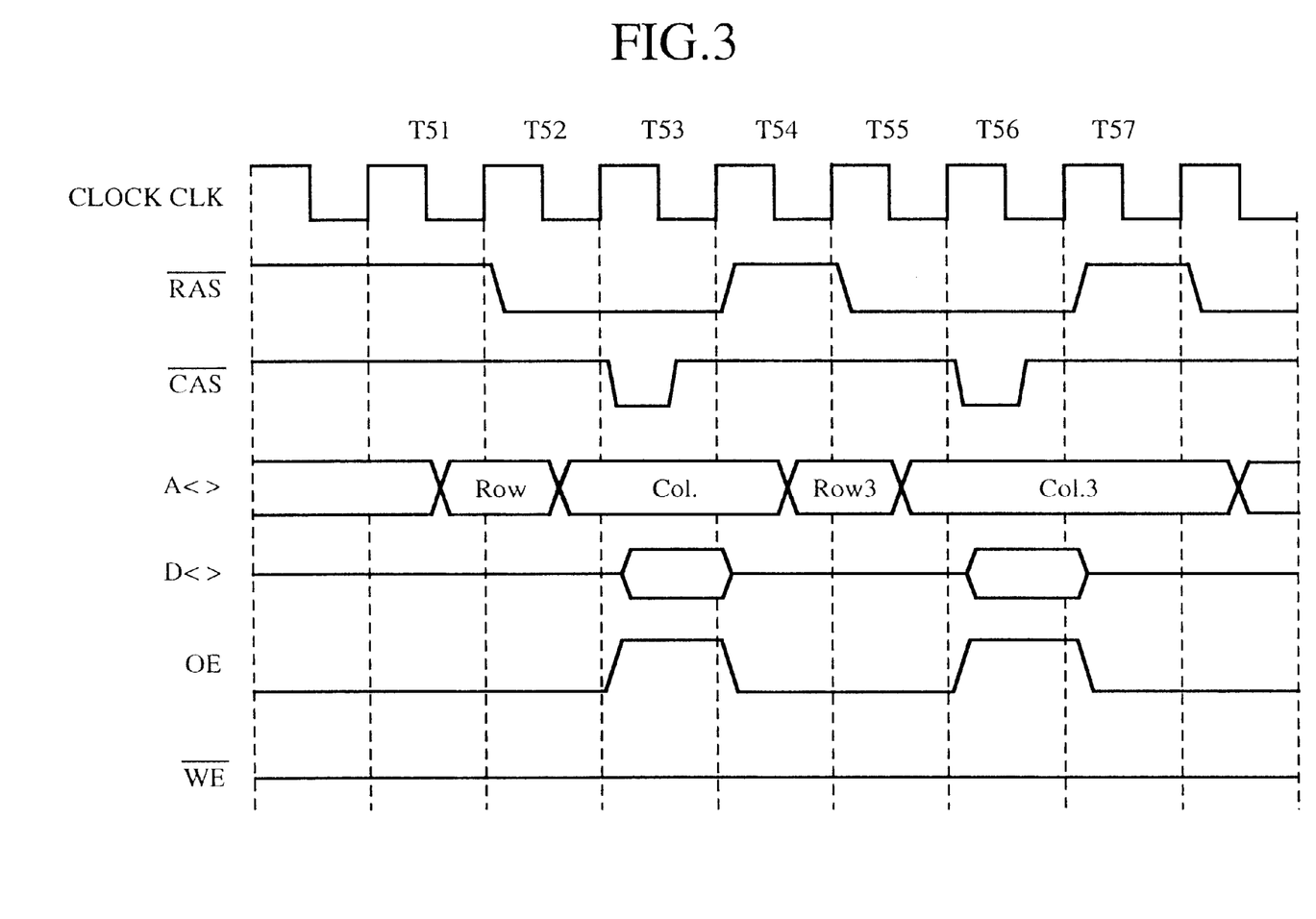
FIG. 3 is a timing chart showing the timing of the data read operation in the second memory circuit.

FIG. 3 is a timing chart showing the timing of the data read operation in the second memory circuit 102. In the timing chart shown in FIG. 3, the reference character CLK designates a clock signal, A < > denotes an address signal such as a row address and a column address. The reference character OE designates a control signal indicating an output timing of data read from the second memory circuit 102, and /WE denotes a control signal indicating a writing timing of data to the second memory circuit 102. The reference character D < > designates data read from the second memory circuit 102 as a DRAM.

Next, a description will be given of the operation of the conventional semiconductor processing device.

In the memory test of the semiconductor processing device on which two kinds of memory circuits 101 and 102 are mounted shown in FIG. 1, the first memory circuit 101 and the second memory circuit 102 are executed in different timings by using different access commands, respectively.

First, the memory test for the first memory circuit 101 is executed by the following manner.

In the data read operation, the row address A2HCAADDR and the RAS signal A1LCRAS and the like are outputted to the first memory circuit 101 at the timing T42 in order to set the first memory circuit 101 in an active state.

Next, at the timing T43, the memory field storing data in the first memory circuit 101 designated by the row address and the column address enters a data read state when the column address A2HCAADDR and the CAS signal A1LCCAS are inputted to the first memory 101. The data N1INDATA stored in the memory field is then read and outputted to the data bus when the control signal A1HCDDE of the H level is inputted to the first memory 101.

After the memory test operation for the first memory circuit 101 is completed, the memory test operation for the second memory circuit 102 will be executed. At the timing T52 shown in FIG. 3, the second memory circuit 102 enters the active state when receiving the row address A < > and the control signal /RAS.

Following this operation, at the timing T53 shown in FIG. 3, the column address A < > and the /CAS signal are supplied to the second memory circuit 102. Then, at the timing when the control signal OE is inputted, the data stored in the memory field in the second memory circuit 102 indicated by the row address and the column address is read and outputted to the data bus (not shown).

Because the conventional semiconductor processing device incorporating two kinds of the memory circuits 101 and 102, whose operation timings are different and operate based on different access methods, has the configuration described above, it must be required to execute the memory test operation for each of the memory circuits 101 and 102, independently. Accordingly, it is required to prepare test patterns for each kind of the memory circuits 101 and 102. This configuration of the conventional semiconductor processing device introduces several drawbacks that test patterns becomes complicated, a test period becomes long, and the cost of the memory test operation is increased.

SUMMARY OF THE INVENTION

Accordingly, an object of the present invention is, with due consideration to the drawbacks of the conventional technique, to provide a memory test circuit, incorporated in a semiconductor processing device, capable of efficiently and easily executing a memory test operation even if a semiconductor processing device incorporating different kinds of memory circuits whose operation timings and accessing methods are different.

In accordance with a preferred embodiment of the present invention, a memory test circuit incorporated in a semiconductor processing device, comprises a plurality of memory means whose operation timings and accessing methods are different and control means. The control means controls test operation for the plurality of memory means. The control means recognizes the plurality of memory means as one continuous memory means based on control signal supplied from an external device, and selects one of the plurality of memory means based on the received control signals and transfers the control signals and data to be written to the selected memory means, and then reads data from the selected memory means, and transfers the read data to the external device, and then selects a following memory means in the plurality of memory means and performs the above test operation, and wherein the control means performs the test operation for all of the plurality of memory means in order continuously based on the received control signals and data.

In the memory test circuit as another preferred embodiment of the present invention, the control means is incorporated per the memory means, and the control means inputs an address for addressing a memory field in the memory means and an access command for designating access methods as the control signals and the control means decodes the address and the access command, and then selects one of the plurality of memory means based on a predetermined bit in the address, and outputs the address, the access command, the data to the selected memory means, and reads data from the selected memory means based on the address and the access command, and transfers the data read to the external device. In addition, after the test operation of the selected memory means is completed, the control means selects following memory means in the plurality of memory means in order to execute the test operation based on a predetermined bit in a following received address, and continuously executes the test operation for all of the plurality of memory means.

In the memory test circuit as another preferred embodiment of the present invention, the control means is incorporated per the memory means, and the control means inputs an address for addressing a memory field in the memory means, an access command for designating access methods as the control signals, and a control command for selecting one of the plurality of memory means. The control means decodes the address, the access command, and the control command, and then selects one of the plurality of memory means based on the control command, and outputs the address, the access command, the data to the selected memory means, and reads data from the selected memory means based on the address and the access command, and transfers the data read to the external device. After the test operation of the selected memory means is completed, the control means selects following memory means in the plurality of memory means in order to execute the test operation based on a following received control command, and continuously executes the test operation for all of the plurality of memory means.

The memory test circuit as another preferred embodiment of the present invention, further comprises a comparison means for comparing data read from the plurality of memory means. In the memory test circuit, the control means is incorporated per memory means, and the control means inputs addresses for addressing memory fields in the plurality of memory means, and access commands for designating access methods as the control signals, the control means decodes the addresses and the access commands, and outputs the addresses, the access commands, and the data to the plurality of memory means, and reads data from the plurality of memory means based on the addresses and the access commands, and transfers the data to the comparison means, simultaneously. The comparison means compares the data read from the plurality of memory means in order to check whether or not operations of the plurality of memory means are correct.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

First Embodiment

Figure 4:
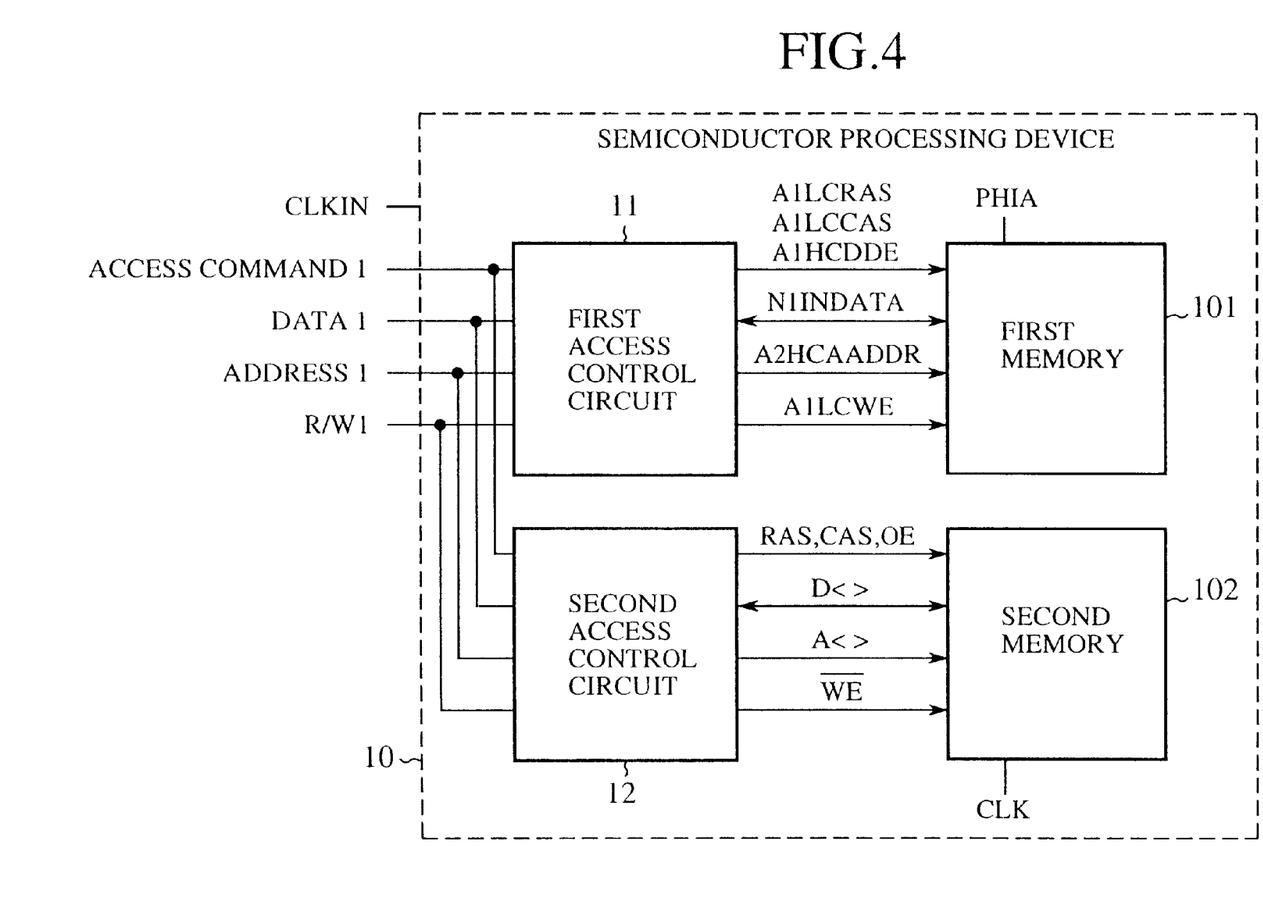
FIG. 4 is a block diagram showing a configuration of a memory test circuit incorporated in a semiconductor processing device according to the first embodiment of the present invention.

FIG. 4 is a block diagram showing a configuration of a memory test circuit incorporated in a semiconductor processing device according to the first embodiment of the present invention. In FIG. 4, The reference number 101 designates a first memory circuit of 1 MB as a DRAM operating based on a clock signal PHIA of 100 MHz. The reference number 102 denotes a second memory circuit of 1 MB as a DRAM operating based on a clock signal CLK of 25 MHz. The reference number 11 designates a first access control circuit for inputting an access command 1 and generates a control signal to access the first memory circuit 101 of 1 MB. The reference number 12 designates a second access control circuit for inputting the access command 1 and generates a control signal to access the second memory circuit 102 of 1 MB. The reference number 10 designates the semiconductor processing device incorporating the first access control circuit 11 and the second access control circuit 12 forming the memory test circuit, the first memory circuit 101, and the second memory circuit 102. The reference character CLKIN designates an external clock signal to be used for operating the semiconductor processing device 10.

The first access control circuit 101 and the second access control circuit 102 input and decode the access command 1, the address 1, the R/W signal 1, and then output the data to the first memory circuit 101 and the second memory circuit 2 in order to get the data (DATA 1 as the data N1INDATA from the first memory circuit 101 and the data D < > from the second memory circuit 102 shown in FIG. 4) from the first memory circuit 101 and the second memory circuit 102.

The address signal ADDRESS 1 to be supplied to the semiconductor processing device 10 includes an additional bit to be used for selecting one of the first memory circuit 101 and the second memory circuit 102 in addition to an address (that is also used for the conventional one) indicating a memory field.

Although the number of the memory circuits is two in the first embodiment, the present invention is not limited by this configuration. For example, it is possible to increase the number of the memory circuits incorporated in the semiconductor processing device and to select one of the memory circuits by increasing the number of additional bits in the address 1 according to the number of memory circuits.

The first memory circuit 101 of 1 MB operates based on the clock signal PHIA of 100 MHz. The second memory circuit 102 of 1 MB operates based on the clock signal CLK of 25 MHz. The semiconductor processing device 10 as the system according to the first embodiment shown in FIG. 4 operates based on the clock signal of 25 MHz. The semiconductor processing device 10 operates based on the clock signal CLKIN of 25 MHz.

The semiconductor processing device 10 as the system comprises the first access control circuit 11, the second access control circuit 12, and two kinds of the first memory circuit 101 and the second memory circuit 102. However, the number of the memory circuits is not limited.

Next, a description will be given of the operation of the semiconductor processing device as the first embodiment.

Figure 5:
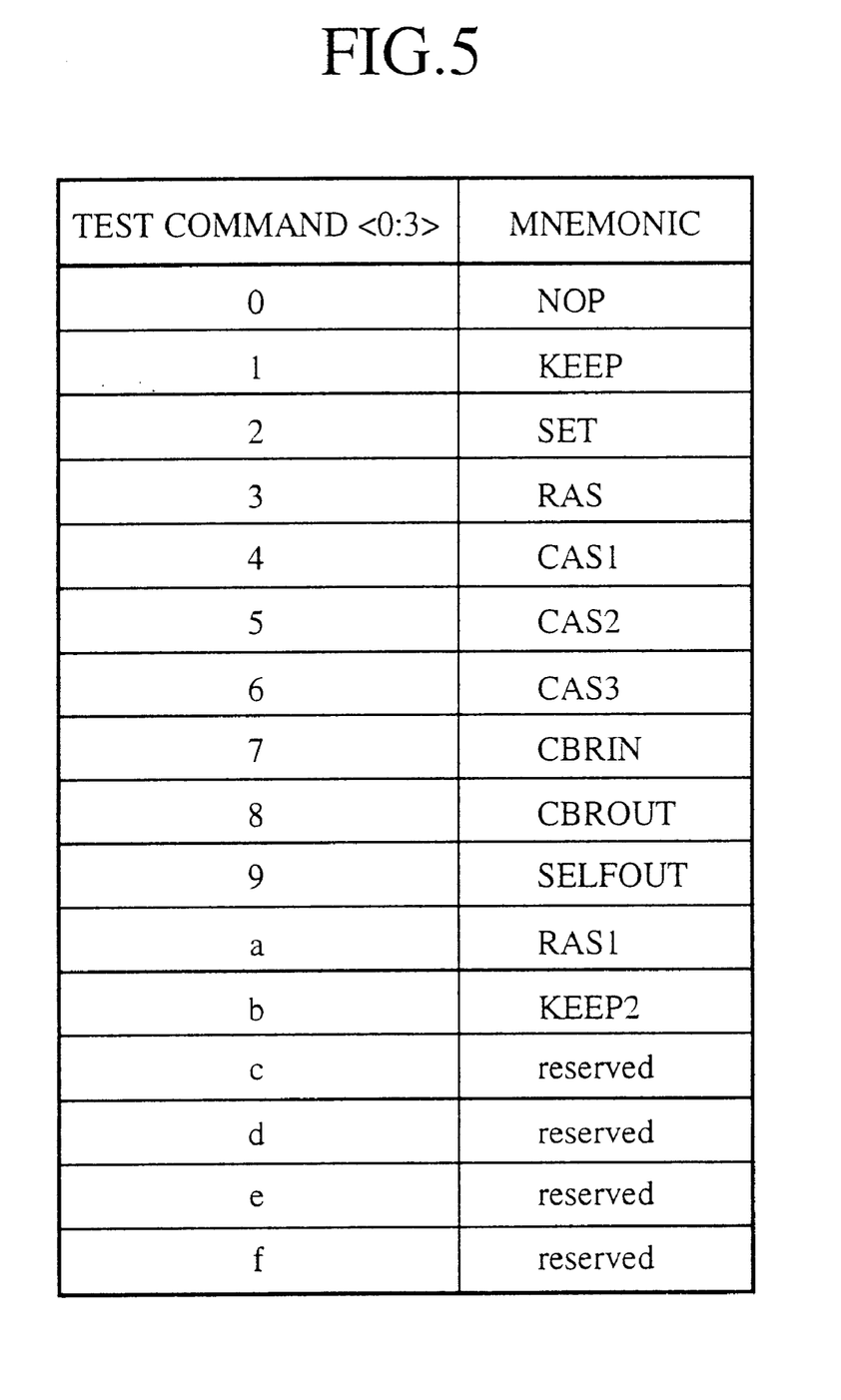
FIG. 5 is an explanation diagram showing eleven test commands to be used for test operation of the memory circuits incorporated in the semiconductor processing device shown in FIG. 4.

FIG. 5 is an explanation diagram showing eleven test commands to be used for the memory test operation for the first and second memory circuits 101 and 102 incorporated in the semiconductor processing device 10 shown in FIG. 4. Those test commands are provided as the access command 1 from an external device (not shown) to the first access control circuit 101 and the second access control circuit 102 in the semiconductor processing device 10. The first access control circuit 11 and the second access control circuit 12 receive the access command 1 and then decode the received one.

Figure 6:
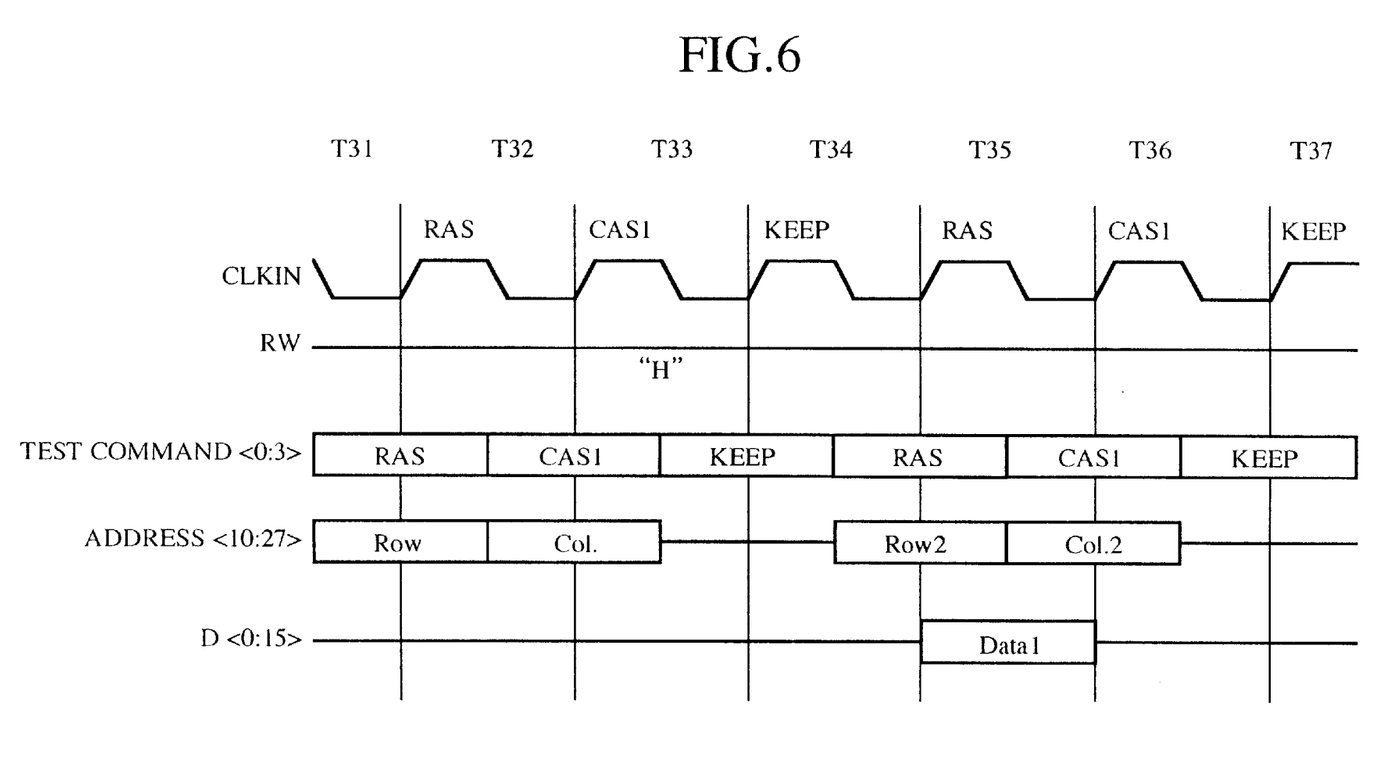
FIG. 6 is a timing chart showing a continuous data read operation from the memory circuits.

FIG. 6 is a timing chart showing continuous data read operation from the first memory circuit 101. The timing chart shown in FIG. 6 is a timing result observed by an external device that is located outside of the semiconductor processing device 10.

FIG. 2 is the timing chart of the data read operation for the first memory circuit 101. In FIG. 2, the reference character A2HCAADDR is an address signal, A1HCDDE is a control signal to control a timing of the data output onto the data bus (not shown). The reference character A1LCCAS is a control signal CAS for the data read from the first memory circuit 101. The reference character A1LCWE denotes a control signal indicating the data write operation when its level is the L level, and the data read operation when its level is the H level.

In the timing chart shown in FIG. 2, the control signal A1LCWE indicates the data read operation because its level is the H level. The data signal N1INDTA indicates the data from the first memory circuit 101.

FIG. 3 is the timing chart of the data read operation for the second memory circuit 102. In FIG. 3, the reference character CLK designates a clock signal, A< > indicates an address signal such as a row address and a column address, OE designates a control signal indicating the output timing of the data from the second memory circuit 102, /WE denotes a control signal indicating the data writing timing to the second memory circuit 102, and D < > designates the data from the second memory circuit 102 as the DRAM.

The memory test operation for the first memory circuit 101 and the second memory circuit 102 incorporated in the semiconductor processing device 10 shown in FIG. 4 is executed by the following manner.

At the timing T32 which indicates a rising edge of the external clock CLKIN shown in the timing chart of FIG. 6, the first access control circuit 11 inputs the RAS as the test command TESTCMD <0:3> in the access command 1 and the ROW as the row address A<10:27> in the address signal ADDRESS 1 supplied from the external device (not shown).

Next, the first access control circuit 11 decodes the RAS as the test command TESTCMD <0:3>. In this case, because the first memory circuit 101 is selected based on the value of the last bit (for example, the value of the last bit is 1) in the address signal ADDRESS 1 inputted, the test command decoded is supplied to the first memory circuit 101. At the timing T42 in the timing chart shown in FIG. 2, when inputting the test command transferred from the first access control circuit 11, the first memory circuit 101 enters the active state.

Next, at the timing T33 shown in the timing chart of FIG. 6, the first access control circuit 11 inputs the CAS 1 as the test command TESTCMD <0:3> and the column address Col in the access command 1, and decodes them, and outputs the decoded results to the first memory circuit 101. Thereby, the first memory circuit 101 enters a data read state because the first memory circuit 101 inputs the row address and the column address.

Next, as shown at the timing T43 shown in the timing chart of FIG. 2, when the level of the control signal A1HCDDE becomes the H level, the data N1INDATA stored in the memory field in the first memory circuit 101 is read and outputted to the data bus (not shown).

The first memory circuit 101 continuously outputs the data N1INDATA onto the data bus in order to keep the state shown in the timing T43 of FIG. 2 when the first access control circuit 11 inputs and then decodes a KEEP command as the test command TESTCMD <0:3> as shown at the timing T34 of FIG. 6. The data N1INDATA on the data bus is outputted as read data (DATA 1 shown in FIG. 1) to an external device (not shown), that is located outside of the semiconductor processing device 10, at the timing T35 shown in FIG. 6.

At both the timings T35 and T36 shown in the timing chart of FIG. 6, the address A<10:27> is changed from data "Row" and "Col." to data "Row2" and "Col.2". In this case, the continuous data read operation is executed like the case shown at both the timings T32 and T33.

The first access control circuit 11 transfers the data DATA 1 read from the first memory circuit 101 to the external device (not shown) that is located outside of the semiconductor processing device 10. The external tester compares the DATA 1 with expected data that have been prepared in advance by the external tester in order to check whether or not the operation of the first memory circuit 101 is correct.

After the completion of the data read of 1 MB from the first memory circuit 101, the value of the final bit in the address 1 that are supplied from the external device (not shown) to the semiconductor processing device 10 is changed to the value indicating the second memory circuit 102.

The second access control circuit 12 inputs the address 1 and decodes it. As a result, the data read operation from the second memory circuit 102 incorporated in the semiconductor processing device 10 shown in FIG. 4 will be initiated automatically based on the value (for example, the value is 1) of the final bit in the address signal ADDRESS 1.

At the timing T32 indicating a rising edge of the external clock CLKIN in the timing chart shown in FIG. 6, the second access control circuit 12 inputs the RAS as the test command TESTCMD <0:3> in the access command 1 and the ROW as the row address A<10:27> in the address signal ADDRESS 1 supplied from the external device (not shown).

Next, the second access control circuit 12 decodes the RAS as the test command TESTCMD <0:3>. In this case, because the second memory circuit 102 is selected based on the value of the last bit (for example, the value of the last bit is 0) in the inputted address. 1, the second access control circuit 102 outputs the decoded test command to the second memory circuit 102.

At the timing T52 shown in the timing chart of FIG. 3, when inputting the test command transferred from the second access control circuit 12, the second memory circuit 102 enters the active state.

Next, at the timing T33 shown in the timing chart of FIG. 6, the second access control circuit 12 inputs the CAS 1 as the test command TESTCMD <0:3> and the column address "Col." in the access command 1, and then decodes them, and outputs the decoded results to the second memory circuit 102. Thereby, the second memory circuit 102 enters a data read state because the second memory circuit 102 inputs the row address "Row" and the column address "Col.".

Next, as shown at the timing T53 in the timing chart of FIG. 3, the data D < > stored in the memory field in the second memory circuit 102 addressed by the row address "Row" and the column address "Col." is read and outputted to the data bus (not shown) when the level of the control signal OE becomes the H level. The second memory circuit 102 continuously outputs the data D < > onto the data bus in order to keep the state shown in the timing T53 of FIG. 3 because the second access control circuit 12 inputs and then decodes the KEEP command as the test command TESTCMD <0:3> as shown at the timing T34 in FIG. 6.

The data D < > on the data bus is outputted as read data (DATA 1 shown in FIG. 4) to the external device (not shown) that is located outside of the semiconductor processing device 10 at the timing T35 shown in FIG. 6. The external tester then compares the DATA 1 with expected data that have been prepared in advance by the external tester in order to check whether or not the operation of the second memory circuit 102 is correct.

At the timings T35 and T36 in the timing chart shown in FIG. 6, the address A<10:27> is changed from data "Row" and "Col." to data "Row2" and "Col.2". In this case, the continuous data read operation is executed like the case shown in the timings T32 and T33.

As described above, according to the first embodiment of the present invention, the access control circuits 11 and 12 are incorporated in the semiconductor processing device 10 on which the plurality of the memory circuits 101 and 102 whose access commands and timings are different are mounted, the access control circuits 11 and 12 controls the operation of the memory circuits 101 and 102, for example, select one of the memory circuits 101 and 102 based on the desired bits in the address generated by and supplied from an external device such as an external tester, generate access commands corresponding to the selected memory circuit as a target one for the data write operation and the data read operation, and output the generated access commands to the target memory circuit. It is thereby possible to recognize the memory circuits as continuously connected memory circuits, and to execute the memory test operation for the memory circuits by using common test patterns. Accordingly, it is not necessary to prepare test patterns for each memory circuit and to execute the memory test operation per memory circuit. This introduces the test patterns of an easy preparation and the memory test operation of a high efficiency for the memory circuits. On the contrary, in a conventional semiconductor processing device, different test patterns are required and the memory test operation is executed per memory circuit.

Second Embodiment

Figure 7:
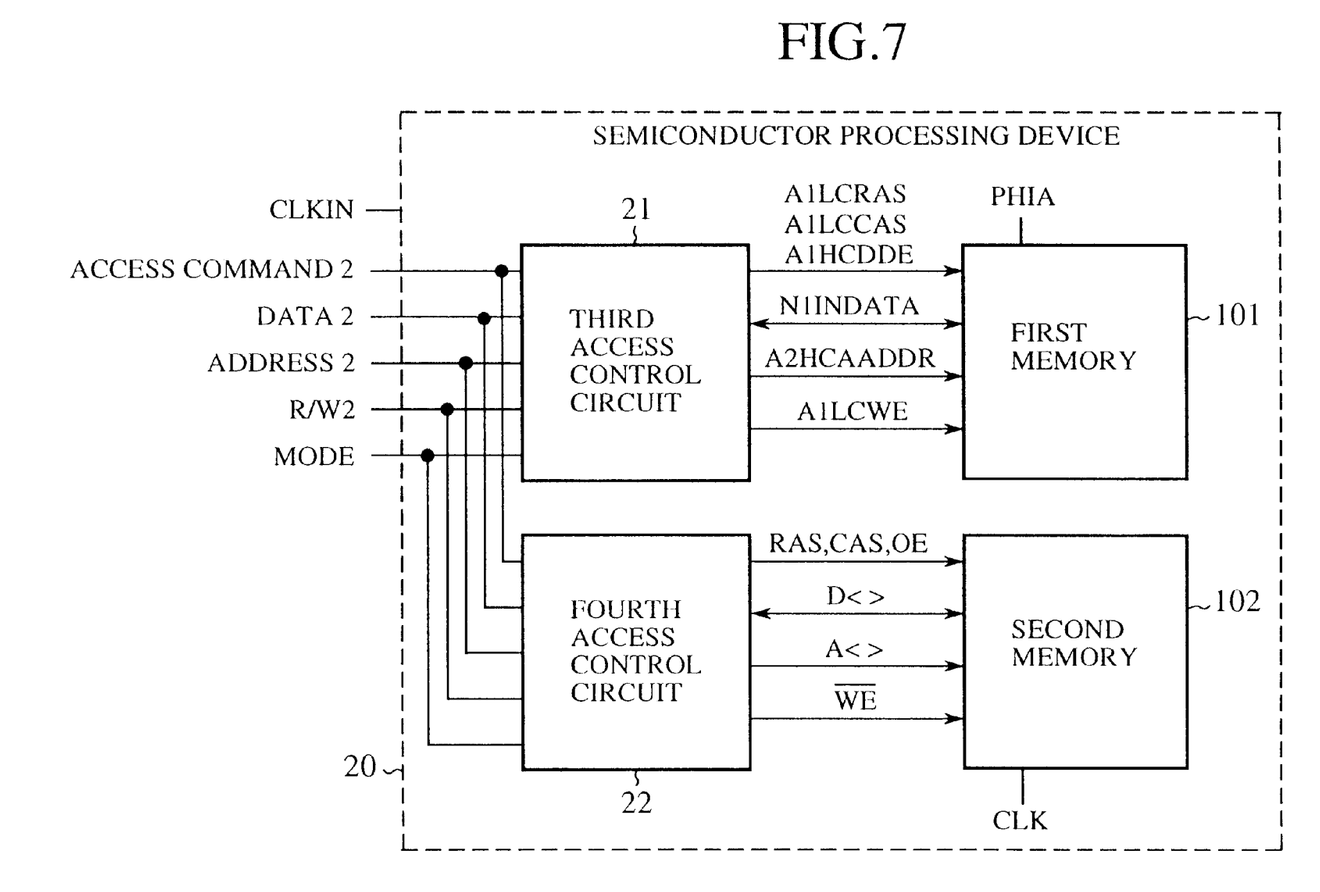
FIG. 7 is a block diagram showing a configuration of a memory test circuit incorporated in a semiconductor processing device according to the second embodiment of the present invention.

FIG. 7 is a block diagram showing a configuration of a memory test circuit incorporated in a semiconductor processing device according to the second embodiment of the present invention. In FIG. 7, the reference number 21 designates a third access control circuit for inputting an access command 2 in order to generate control signals to be used for accessing the first memory circuit 101 of 1 MB. The reference number 22 designates a fourth access control circuit for inputting the access command 2 in order to generate control signals to be used for accessing the second memory circuit 102 of 1 MB. The reference character CLKIN denotes an external clock signal of 25 MHz to be used for the operation of the semiconductor processing device 20.

Both the third access control circuit 21 and the fourth access control circuit 22 forming the memory test circuit input and then decode the access command 2, an address signal ADDRESS 2, a R/W signal 2. The third access control circuit 21 and the fourth access control circuit 22 output the decoded data to the first memory circuit 101 and the second memory circuit 102 and read data from the first memory circuit 101 and the second memory circuit 102.

In the semiconductor processing device 20 incorporating the third access control circuit 21 and the fourth access control circuit 22 as the memory test circuit according to the second embodiment inputs the access command 2 and the address signal ADDRESS 2 in order to execute the memory test operation.

By the way, the address signal ADDRESS 1 to be used in the semiconductor processing device as the first embodiment includes the additional bit in order to select one of the memory circuits 101 and 102 for test operation. On the other hand, the address signal ADDRESS 2 to be used in the second embodiment does not include the additional bit to select one of the memory circuits. The third access control circuit 21 and the fourth access control circuit 22 input a mode signal MODE instead of this additional bit in the address signal ADDRESS 1. The mode signal MODE is generated by an external device such as an external tester (not shown) and transferred from the external tester to the semiconductor processing device 20.

The semiconductor processing device 20 according to the second embodiment comprises the third access control circuit 21, the fourth access control circuit 22, the first memory circuit 101, and the second memory circuit 102.

In the same manner as the first embodiment, the memory size of the first memory circuit 101 is 1 MB and the memory size of the second memory circuit 102 is also 1 MB in the second embodiment. In addition, the first memory circuit 101 operates based on the clock signal PHIA of 100 MHz and the second memory circuit 102 operates based on the clock signal CLK of 25 MHz. The semiconductor processing device 20 operates based on the clock signal CLKIN of 25 MHz.

Next, a description will be given of the operation of the semiconductor processing device 20 as the second embodiment of the present invention.

In the following explanation for the second embodiment, the test commands shown in FIG. 5 and the timing charts shown in FIGS. 2, 3 and 6 that have been used in the explanation of the first embodiment will be also used in addition to the block diagram of the configuration of the semiconductor processing device 20 shown in FIG. 7.

First, the control signal MODE of the H level is supplied from the external tester (not shown) to the third access control circuit 21 in order to execute the memory test operation for the first memory circuit 101.

When receiving the control signal MODE, the third access control circuit 21 inputs the RAS as the test command TESTCMD <0:3> in the access command 2 and the ROW as the row address A<10:27> in the address 2 at the rising edge of the external clock signal CLKIN shown at the timing T32 in FIG. 6.

Next, the third access control circuit 21 decodes the RAS as the test command TESTCMD <0:3> and then outputs the decoded test command to the first memory circuit 101.

When receiving the decoded test command from the third access control circuit 21, the first memory circuit 101 enters the active state at the timing T42 shown in FIG. 2.

At the timing T33 shown in FIG. 6, the third access control circuit 21 inputs and decodes "CAS1" and "Col." in the test command TESTCMD <0:3> in the access command 2 and then outputs the decoded data to the first memory circuit 101. Thereby, the first memory circuit 101 enters the data read state because it has inputted the row address and the column address.

Next, as shown at the timing T43 of FIG. 2, when the level of the control signal A1HCDDE is the H level, the data N1INDATA stored in the memory field in the first memory circuit 101 addressed by the row address and the column address is read and transferred to the data bus (not shown).

The first memory circuit 101 continuously outputs the data N1INDATA onto the data bus in order to keep the state shown at the timing T43 of FIG. 2 when the third access control circuit 21 inputs and then decodes the KEEP command as the test command TESTCMD <0:3> as shown at the timing T34 of FIG. 6.

The data N1INDATA on the data bus is outputted as read data (DATA 2 shown in FIG. 7) to the external device such as the external tester (not shown) at the timing T35 shown in FIG. 6. The external device compares the data DATA 2 with expected data that have been prepared in advance by the external tester in order to check whether or not the operation of the first memory circuit 101 is correct.

At the timings T35 and T36 in the timing chart shown in FIG. 6, the address A<10:27> is changed from data "Row" and "Col." to data "Row2" and "Col.2". In this case, the continuous data read operation is executed like the case shown by both the timings T32 and T33.

After the completion of the data read of 1 MB from the first memory circuit 101, the mode signal MODE of the L level is supplied from the external device (not shown) to the semiconductor processing device 20.

When the fourth access control circuit 22 inputs the control signal MODE of the L level, the data read operation from the second memory circuit 102 incorporated in the semiconductor processing device 20 shown in FIG. 7 will be initiated automatically. The data read operation from the second memory circuit 102 under the control of the fourth access control circuit 22 will be explained.

As shown at the timing T32 of FIG. 6, the fourth access control circuit 22 inputs the RAS as the test command TESTCMD <0:3> in the access command 2 and the ROW as the row address A <10:27> in the address 2 supplied from the external device (not shown) at the rising edge of the external clock CLKIN.

Next, the fourth access control circuit 22 decodes the RAS as the test command TESTCMD <0:3>. The fourth access control circuit 22 selects the second memory circuit 102 based on the level (L level) of the control signal MODE, and outputs the decoded test command to the second memory circuit 102.

At the timing T52 shown in the timing chart of FIG. 3, when inputting the test command transferred from the fourth access control circuit 22, the second memory circuit 102 enters the active state.

Next, at the timing T33 in the timing chart shown FIG. 6, the fourth access control circuit 22 inputs the CAS 1 as the test command TESTCMD <0:3> and the column address "Col." in the access command 2, and decodes them, and outputs the decoded results to the second memory circuit 102. Thereby, the second memory circuit 102 enters the data read state because the second memory circuit 102 inputs the row address "Row" and the column address "Col.".

Next, as shown at the timing T53 in the timing chart of FIG. 3, the data D < > stored in the memory field in the second memory circuit 102 addressed by the row address "Row" and the column address "Col." is read and outputted to the data bus (not shown) when the level of the control signal OE becomes the H level. The second memory circuit 102 continuously outputs the data D < > onto the data bus in order to keep the state shown in the timing T53 shown in FIG. 3 because the fourth access control circuit 12 inputs and then decodes the KEEP command as the test command TESTCMD <0:3> as shown at the timing T34 of FIG. 6.

The data D < > on the data bus are outputted as read data (DATA 2 shown in FIG. 7) to the external device (not shown) that is located outside of the semiconductor processing device 20 at the timing T35 shown in FIG. 6. The DATA 2 that have been read from the second memory circuit 102 and transferred to the external tester (not shown) are compared with expected data that have been prepared in advance by the external tester in order to check whether or not the operation of the second memory circuit 102 is correct.

At the timings T35 and T36 in the timing chart shown in FIG. 6, the address A<10:27> is changed from data "Row" and "Col." to data "Row2" and "Col.2". In this case, the continuous data read operation is executed like the case shown in the timings T32 and T33.

As described above, according to the second embodiment of the present invention, the access control circuits 21 and 22 are incorporated in the semiconductor processing device 20 on which the plurality of the memory circuits 101 and 102 whose access commands and timings are different are mounted, the access control circuits 21 and 22 control the operation of the memory circuits 101 and 102, for example, select one of the memory circuits 101 and 102 based on the level of the control signal MODE generated by and supplied from the external device such as the external tester, generate access commands corresponding to the selected memory circuit as a target of the memory test operation, and output the generated access commands to the target memory circuit.

It is thereby possible to recognize the memory circuits 101 and 102 as continuously connected memory circuits, and to execute the memory test operation for the memory circuits 101 and 102 by using common test patterns. Accordingly, it is not necessary to prepare test patterns for each memory circuit and to execute the memory test operation per memory circuit. This introduces the test patterns of an easy preparation and the memory test operation of a high efficiency for the memory circuits. On the contrary, in a conventional semiconductor processing device different test patterns are required and the memory test operation is executed per memory circuit.

Third Embodiment

Figure 8:
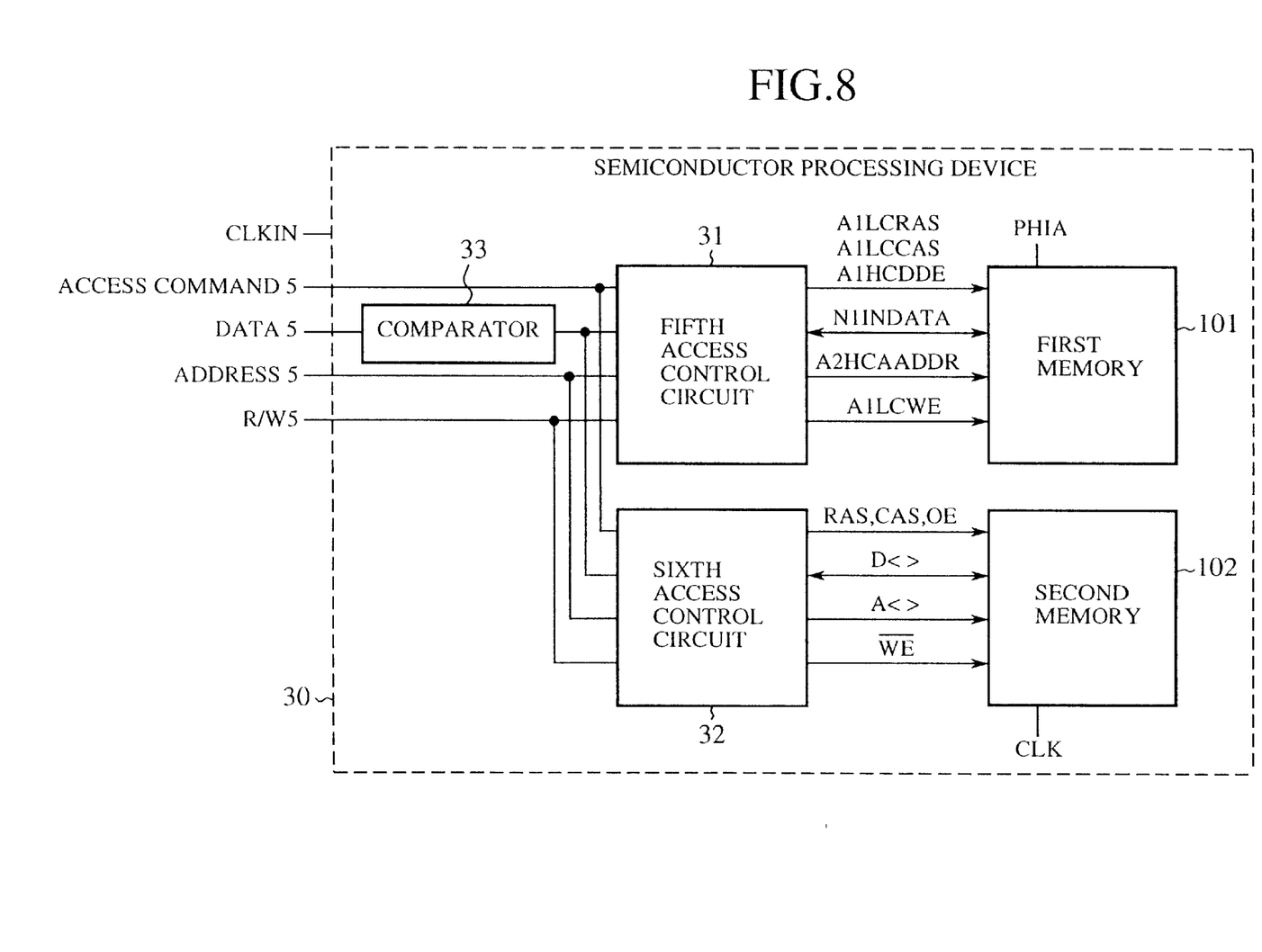
FIG. 8 is a block diagram showing a configuration of a memory test circuit incorporated in a semiconductor processing device according to the third embodiment of the present invention.

FIG. 8 is a block diagram showing a configuration of a memory test circuit incorporated in a semiconductor processing device according to the third embodiment of the present invention. In FIG. 8, the reference number 31 designates a fifth access control circuit for inputting an access command 5 in order to generate control signals to be used for accessing the first memory circuit 101 of 1 MB. The reference number 32 designates a sixth access control circuit for inputting the access command 5 in order to generate control signals to be used for accessing the second memory circuit 102 of 1 MB. The reference character CLKIN denotes an external clock signal to be used for the operation of the semiconductor processing device 20. The reference number 33 designates a comparator for comparing data read from the first memory circuit 101 to data read from the second memory circuit 102. When both data are equal, the comparator 33 generates and outputs a control signal of the H level, and when both data are not equal, the comparator 33 generates and outputs a control signal of the L level.

Both the fifth access control circuit 31 and the sixth access control circuit 32 input and then decode the access command 5, an address signal ADDRESS 5, and a R/W signal 5. The fifth access control circuit 31 and the sixth access control circuit 32 output the decoded data to the first memory circuit 101 and the second memory circuit 102, and then read data from the first memory circuit 101 and the second memory circuit 102, and output the data to the comparator 33. The data read operations for both the first and second memory circuits 101 and 102 are executed simultaneously by the fifth and sixth access control circuits 31 and 32.

The semiconductor processing device 30 comprises the fifth access control circuit 31 and the sixth access control circuit 32 as the memory test circuit, and the first and second memory circuits 101 and 102.

The semiconductor processing device 30 of the third embodiment inputs the access command 5 and the address signal ADDRESS 5, the fifth and sixth access control circuits 31 and 32 decode the access command 5 and the address 5 and generate control signals to be used for executing the memory test operations of the first and second memory circuits 101 and 102 simultaneously.

Like the first and second embodiments, the memory size of the first memory circuit 101 is 1 MB and the memory size of the second memory circuit 102 is also 1 MB in the third embodiment. In addition, the first memory circuit 101 operates based on the clock signal PHIA of 100 MHz and the second memory circuit 102 operates based on the clock signal CLK of 25 MHz. The semiconductor processing device 30 operates based on the clock signal CLKIN of 25 MHz.

Next, a description will be given of the operation of the memory test circuit incorporated in the semiconductor processing device 30 as the third embodiment of the present invention.

In the following explanation for the third embodiment, the test commands shown in FIG. 5 and the timing charts shown in FIGS. 2, 3 and 6 that have been used in the explanation of the first embodiment will be also used in addition to the block diagram of the configuration of the semiconductor processing device 20 shown in FIG. 8.

First, for the memory test operation of the first memory circuit 101, the fifth access control circuit inputs the RAS as the test command TESTCMD <0:3> in the access command 5 and the ROW as the row address A<10:27> in the address signal ADDRESS 5 at the rising edge of the external clock signal CLKIN shown at the timing T32 in FIG. 6.

Next, the fifth access control circuit 31 decodes the RAS as the test command TESTCMD <0:3> and then outputs the decoded test command to the first memory circuit 101.

When receiving the decoded test command from the fifth access control circuit 31, the first memory circuit 101 enters the active state at the timing T42 shown in FIG. 2.

At the timing T33 shown in FIG. 6, the fifth access control circuit 31 inputs and decodes "CAS1" and "Col." in the test command TESTCMD <0:3> in the access command 5 and then outputs the decoded data to the first memory circuit 101. Thereby, the first memory circuit 101 enters the data read state because it has inputted the row address and the column address.

Next, as shown at the timing T43 of FIG. 2, when the level of the control signal A1HCDDE is changed to the H level, the data N1INDATA stored in the memory field in the first memory circuit 101 addressed by the row address and the column address is read and transferred to the data bus (not shown).

The first memory circuit 101 continuously outputs the data N1INDATA onto the data bus in order to keep the state shown at the timing T43 of FIG. 2 when the fifth access control circuit 31 inputs and then decodes the KEEP command as the test command TESTCMD <0:3> as shown at the timing T34 of FIG. 6.

The data N1INDATA on the data bus is outputted as read data (DATA 5 in FIG. 8) to the external device such as the external tester (not shown) that is located outside of the semiconductor processing device 30 at the timing T35 shown in FIG. 6.

At the timings T35 and T36 in the timing chart shown in FIG. 6, the address A<10:27> is changed from data "Row" and "Col." to data "Row2" and "Col.2". In this case, the continuous data read operation is executed like the case shown by both the timings T32 and T33.

The sixth access control circuit 33 initiates and executes the memory test operation for the second memory circuit 102. The test operation for the second memory circuit 102 is executed with the memory test operation for the first memory circuit 101 executed by the fifth access control circuit 31, simultaneously.

Next, the memory test operation by the sixth access control circuit 33 will be explained.

As shown at the timing T32 of FIG. 6, the sixth access control circuit 32 inputs the RAS as the test command TESTCMD <0:3> in the access command 5 and the ROW as the row address A<10:27> in the address signal ADDRESS 5 supplied from the external device (not shown) at the rising edge of the external clock CLKIN.

Next, the sixth access control circuit 32 decodes the RAS as the test command TESTCMD <0:3>. The sixth access control circuit 32 outputs the decoded test command to the second memory circuit 102.

At the timing T52 in the timing chart shown in FIG. 3, when inputting the test command transferred from the sixth access control circuit 32, the second memory circuit 102 enters the active state.

Next, at the timing T33 in the timing chart shown FIG. 6, the sixth access control circuit 32 inputs the CAS 1 as the test command TESTCMD <0:3> and the column address "Col." in the access command 5, and decodes them, and outputs the decoded results to the second memory circuit 102. Thereby, the second memory circuit 102 enters the data read state because the second memory circuit 102 inputs the row address Row and the column address Col.

Next, as shown at the timing T53 in the timing chart of FIG. 3, the data D < > stored in the memory field in the second memory circuit 102 addressed by the row address "Row" and the column address "Col." is read and outputted to the data bus (not shown) when the level of the control signal OE becomes the H level. The second memory circuit 102 continuously outputs the data D < > onto the data bus in order to keep the state shown in the timing T53 shown in FIG. 3 because the sixth access control circuit 32 inputs and then decodes the KEEP command as the test command TESTCMD <0:3> as shown at the timing T34 in FIG. 6.

Then, the sixth access control circuit 33 outputs the data D< > on the data bus to the comparator 33 in the semiconductor processing device 30.

At the timings T35 and T36 in the timing chart shown in FIG. 6, the address A<10:27> is changed from data "Row" and "Col." to data "Row2" and "Col.2". In this case, the continuous data read operation is executed like the case shown in the timings T32 and T33.

Thus, the fifth access control circuit 31 and the sixth access control circuit 32 execute the data read operation from the first and secondmemory circuits 101 and 102, simultaneously, and output the data to the comparator 33. The comparator 33 receives the data from the fifth and sixth access control circuits 31 and 32; and compares them. The comparator 33 generates and outputs the data DATA 5 of the H level to the external tester (not shown) when the data are agreed to each other, and outputs the data 6 of the L level to the external tester when both data do not agreed.

As described above, according to the third embodiment of the present invention, the access control circuits 31 and 32 are incorporated in the semiconductor processing device 30 on which the plurality of the memory circuits 101 and 102 whose access commands and timings are different are mounted, the access control circuits 31 and 32 execute the memory test operation of the memory circuits 101 and 102, simultaneously. The comparator 33 incorporated in the semiconductor processing device 30 compares the test results. It is thereby possible to recognize the memory circuits 101 and 102 as continuously connected memory circuits, and to execute the memory test operation for the memory circuits 101 and 102 by using common test patterns. Accordingly, it is not necessary to prepare test patterns for each memory circuit and to execute the memory test operation per memory circuit. This introduces the test patterns of an easy preparation and the memory test operation of a high efficiency for the memory circuits. On the contrary, in a conventional semiconductor processing device different test patterns are required and the memory test operation is executed per memory circuit.

As described above in detail, because the memory test circuit incorporated in the semiconductor processing device of the present invention has the following configuration: When a plurality of memory means have different operation timings and accessing methods, a control means for controlling test operation for the plurality of memory means can recognize the plurality of memory means as one continuous memory means based on a control signal, for example, based on a value of a predetermined bit in an address supplied from an external device. The control means selects one of the plurality of memory means based on the received control signal, and transfers the control signals and data to be written to the selected memory means. The control means then reads data from the selected memory means, and transfers the read data to the external device. Further, the control means selects a following memory means in the plurality of memory means and performs the above test operation, repeatedly. The control means continuously performs the test operation for all of the plurality of memory means in order based on the received control signals and data. Thereby, the present invention has the effect that it is not necessary to prepare test patterns for each memory means and to execute the memory test operation per memory means. This introduces the test patterns of an easy preparation and the memory test operation of a high efficiency for the memory means. On the contrary, in a conventional semiconductor processing device different test patterns are required and the memory test operation is executed per memory means.

In addition, according to the present invention, because the memory test circuit incorporated in the semiconductor processing device of the present invention has the following configuration: The control means is incorporated per the memory means, and inputs an address for addressing a memory field in the memory means, an access command for designating access methods as the control signals, and a control command for selecting one of the plurality of memory means. The control means decodes the address, the access command, and the control command, and then selects one of the plurality of memory means based on the control command, and outputs the address, the access command, the data to the selected memory means, and reads data from the selected memory means based on the address and the access command, and transfers the data read to the external device. Accordingly, the present invention has the effect that it is not necessary to prepare test patterns for each memory circuit and to execute the memory test operation per memory circuit. This introduces the test patterns of an easy preparation and the memory test operation of a high efficiency for the memory circuits.

Furthermore, according to the present invention, the memory test circuit incorporated in the semiconductor processing device of the present invention further comprises a comparison means for comparing data read from the plurality of memory means. In the memory test circuit, the control means is incorporated per the memory means, and the control means inputs addresses for addressing memory fields in the plurality of memory means, and access commands for designating access methods as the control signals. The control means decodes the addresses and the access commands, and outputs the addresses, the access commands, and the data to the plurality of memory means, and reads data from the plurality of memory means based on the addresses and the access commands, and transfers the data to the comparison means, simultaneously. The comparison means compares the data read from the plurality of memory means in order to check whether or not operations of the plurality of memory means are correct. Thus, the memory test circuit comprising the control means and the comparison circuit executes in parallel the test operation for the plurality of memory means simultaneously, and then provides the test result to an external device. Accordingly, the present invention has the effect that it is not necessary to prepare test patterns for each memory circuit and to execute the memory test operation per memory circuit. This introduces the test patterns of an easy preparation and the memory test operation of a high efficiency for the memory circuits.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A memory test circuit incorporated in a semiconductor processing device, comprising:

a plurality of memory means whose operation timings and accessing methods are different; and control means for controlling test operation for said plurality of memory means, wherein said control means recognizes said plurality of memory means as one continuous memory means based on control signal supplied from an external device, and selects one of said plurality of memory means based on said received control signals and transfers said control signals and data to be written to said selected memory means, and then reads data from said selected memory means, and transfers said read data to said external device, and then selects a following memory means in said plurality of memory means and performs said above test operation, and wherein said control means performs said test operation for all of said plurality of memory means in order continuously based on said received control signals and data.

2. A memory test circuit incorporated in a semiconductor processing device according to claim 1, wherein said control means is incorporated per said memory means, and said control means inputs an address for addressing a memory field in said memory means and an access command for designating access methods as said control signals, and said control means decodes said address and said access command, and then selects one of said plurality of memory means based on a predetermined bit in said address, and outputs said address, said access command, said data to said selected memory means, and reads data from said selected memory means based on said address and said access command, and transfers said data read to said external device, and after said test operation of said selected memory means is completed, said control means selects following memory means in said plurality of memory means in order to execute said test operation based on a predetermined bit in a following received address, and continuously executes said test operation for all of said plurality of memory means.

3. A memory test circuit incorporated in a semiconductor processing device according to claim 1, wherein said control means is incorporated per said memory means, and said control means inputs an address for addressing a memory field in said memory means, an access command for designating access methods as said control signals, and a control command for selecting one of said plurality of memory means, said control means decodes said address, said access command, and said control command, and then selects one of said plurality of memory means based on said control command, and outputs said address, said access command, said data to said selected memory means, and reads data from said selected memory means based on said address and said access command, and transfers said data read to said external device, and after said test operation of said selected memory means is completed, said control means selects following memory means in said plurality of memory means in order to execute said test operation based on a following received control command, and continuously executes said test operation for all of said plurality of memory means.

4. A memory test circuit incorporated in a semiconductor processing device according to claim 1, further comprises comparison means for comparing data read from said plurality of memory means, wherein said control means is incorporated per said memory means, and said control means inputs addresses for addressing memory fields in said plurality of memory means, and access commands for designating access methods as said control signals, said control means decodes said addresses and said access commands, and outputs said addresses, said access commands, and said data to said plurality of memory means, and reads data from said plurality of memory means based on said addresses and said access commands, and transfers said data to said comparison means, simultaneously and said comparison means compares said data read from said plurality of memory means in order to check whether or not operations of said plurality of memory means are correct.

\* \* \* \* \*